(12) United States Patent
He et al.

(10) Patent No.: US 11,800,749 B2
(45) Date of Patent: Oct. 24, 2023

(54) DISPLAY PANEL AND A DISPLAY DEVICE INCLUDING A PIXEL CIRCUIT AND A DRIVER CIRCUIT

(71) Applicant: Xiamen Tianma Micro-Electronics Co., Ltd., Xiamen (CN)

(72) Inventors: Shui He, Xiamen (CN); Ping An, Shanghai (CN); Yaqi Kuang, Shanghai (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 207 days.

(21) Appl. No.: 17/246,443

(22) Filed: Apr. 30, 2021

(65) Prior Publication Data
US 2021/0257429 A1    Aug. 19, 2021

(30) Foreign Application Priority Data
Dec. 30, 2020   (CN) .......................... 202011613287.7

(51) Int. Cl.
| | |
|---|---|
| H01L 51/56 | (2006.01) |
| H10K 59/121 | (2023.01) |
| G09G 3/3233 | (2016.01) |
| H10K 59/124 | (2023.01) |

(52) U.S. Cl.
CPC ....... *H10K 59/1213* (2023.02); *G09G 3/3233* (2013.01); *H10K 59/124* (2023.02)

(58) Field of Classification Search
CPC ............ H01L 27/3262; H01L 27/3258; G09G 3/3233
USPC ........................................................... 438/22
See application file for complete search history.

(56) References Cited

U.S. PATENT DOCUMENTS

| | | | | |
|---|---|---|---|---|
| 9,825,057 B2* | 11/2017 | Yamazaki | ........... | H01L 27/1251 |
| 2014/0151688 A1* | 6/2014 | Yamazaki | ............. | H01L 29/247 |
| | | | | 257/43 |
| 2021/0104588 A1* | 4/2021 | Han | ................... | H01L 51/0554 |

FOREIGN PATENT DOCUMENTS

| | | | |
|---|---|---|---|
| CN | 107591410 A | 1/2016 | |
| CN | 107819005 A | 3/2018 | |
| WO | WO-2020145450 A1 * | 7/2020 | ......... H01L 27/3262 |

* cited by examiner

*Primary Examiner* — Phuc T Dang
(74) *Attorney, Agent, or Firm* — Alston & Bird LLP

(57) ABSTRACT

Provided are a display panel and a display device. The display panel includes a base substrate; a first transistor and a second transistor, where the first transistor and the second transistor are formed on the base substrate, the first transistor includes a first active layer, a first gate, a first source, and a first drain, the first active layer contains silicon, the second transistor includes a second active layer, a second gate, a second source, and a second drain; and a first insulating layer and a second insulating layer, where the first insulating layer is located on a side of the second active layer facing away from the base substrate and between the second gate and the second active layer, the second insulating layer is located on a side of the second active layer facing towards the base substrate.

20 Claims, 9 Drawing Sheets

DISPLAY PANEL AND A DISPLAY DEVICE INCLUDING A PIXEL CIRCUIT AND A DRIVER CIRCUIT

CROSS-REFERENCE TO RELATED APPLICATIONS

This application claims priority to Chinese Patent Application No. 202011613287.7 filed Dec. 30, 2020, the disclosure of which is incorporated herein by reference in its entirety.

TECHNICAL FIELD

Embodiments of the present disclosure relate to the field of display technologies and, in particular, to a display panel and a display device.

BACKGROUND

The organic light-emitting diode (OLED) display panels are becoming more widely used due to their advantages in self-illumination, high contrast, thinness, fast reaction speed, and applicability as a flexible panel.

The OLED element of a conventional OLED display panel is current-driven, and thus a corresponding pixel circuit and a driver circuit need to be provided. The driver circuit provides a drive signal for the pixel circuit so that the pixel circuit provides a drive current for the OLED element to drive the OLED element to emit light. The driver circuit and the pixel circuit of the OLED display panel are provided with transistors. The transistor is often manufactured using oxide semiconductors in which, for example, indium gallium zinc oxide (IGZO) serves as the active layer, to reduce the leakage current in the transistor. However, in the related art, the stability of the IGZO transistor is poor, which thus affects at least one of the driver circuit or the pixel circuit.

SUMMARY

Embodiments of the present disclosure provide a display panel and a display device to improve the stability of a second transistor and ensure the good performance of the driver circuit.

In a first aspect, an embodiment of the present disclosure provides a display panel. The display panel includes a base substrate, a first transistor, a second transistor, a first insulating layer, and a second insulating layer.

The first transistor and the second transistor are formed on the base substrate. The first transistor includes a first active layer, a first gate, a first source, and a first drain. The first active layer contains silicon. The second transistor includes a second active layer, a second gate, a second source, and a second drain. The second active layer contains an oxide semiconductor and is located on a side of the first active layer facing away from the base substrate.

The first insulating layer is located on a side of the second active layer facing away from the base substrate and between the second gate and the second active layer. The second insulating layer is located on a side of the second active layer facing towards the base substrate.

The concentration of hydrogen in the first insulating layer is higher than the concentration of hydrogen in the second insulating layer.

The display panel includes a pixel circuit and a driver circuit providing a driving signal for the pixel circuit. The driver circuit includes the second transistor. The pixel circuit includes the first transistor or the driver circuit includes the first transistor.

In a second aspect, an embodiment of the present disclosure further provides a display device including the display panel described in the first aspect.

The display panel provided by the embodiment of the present disclosure includes a first transistor and a second transistor. The first active layer of the first transistor contains silicon, and the second active layer of the second transistor contains an oxide semiconductor. The first insulating layer is located on a side of the second active layer facing away from the base substrate, and the second insulating layer is located on a side of the second active layer facing towards the base substrate.

DETAILED DESCRIPTION

Figure 1:
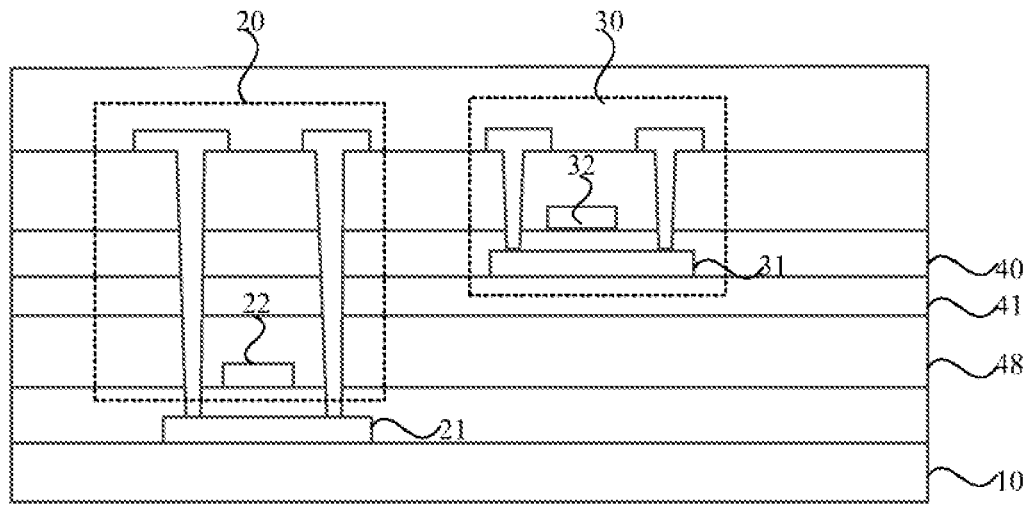
FIG. 1 is a structure diagram of a display panel according to an embodiment of the present disclosure.

Hereinafter the present disclosure will be further described in detail in conjunction with drawings and embodiments. It is to be understood that the embodiments set forth herein are intended to explain the present disclosure and not to limit the present disclosure. Additionally, it is to be noted that for ease of description, merely part, not all, of the structures related to the present disclosure are illustrated in the drawings.

FIG. 1 is a structure diagram of a display panel. As shown in FIG. 1, the display panel 100 includes at least two types of transistors formed on the base substrate 10. The at least two types of transistors contain silicon, which may be polysilicon. For example, the at least two types of transistors are a transistor 20 in which a low temperature poly-silicon (LTPS) material is used as an active layer and a transistor 30 in which an oxide semiconductor material is used as an active layer.

The LTPS transistor has the advantages of high carrier mobility, fast response, and low power consumption, and the oxide semiconductor transistor has the advantage of low leakage current. Therefore, when the display panel 100 includes both the transistor 20 with the LTPS material as the active layer 21 and the transistor 30 with the oxide semiconductor material as the active layer 31, high performance of the display panel 100 can be achieved.

The defects in the LTPS material can be reduced by increasing the concentration of hydrogen in the insulating layer 48 on a side of the active layer 21 facing away from the base substrate 10. However, since the oxide semiconductor material is sensitive to hydrogen, when the insulating layers 40 and 41 are provided on both sides of the active layer 31, the insulating layers 40 and 41 are made of a material that contains no hydrogen, for example, silicon oxide. But it has been determined that after the silicon oxide film is formed, the bonds of some oxygen atoms may be in a dandling state so that defects are formed. These defects generate impacts such as trapping carriers in the transistor 30, thereby affecting the stability of the transistor 30.

To rectify the above problems, in an embodiment, the display panel provided by the embodiment of the present disclosure includes a base substrate, a first transistor, a second transistor, a first insulating layer, and a second insulating layer.

The first transistor and the second transistor are formed on the base substrate. The first transistor includes a first active layer, a first gate, a first source, and a first drain. The first active layer contains silicon. The second transistor includes a second active layer, a second gate, a second source, and a second drain. The second active layer contains an oxide semiconductor and is located on a side of the first active layer facing away from the base substrate.

The first insulating layer is located on a side of the second active layer facing away from the base substrate and between the second gate and the second active layer. The second insulating layer is located on a side of the second active layer facing towards the base substrate.

The concentration of hydrogen in the first insulating layer is higher than the concentration of hydrogen in the second insulating layer.

The display panel includes a pixel circuit and a driver circuit providing a driving signal for the pixel circuit. The driver circuit includes the second transistor. The pixel circuit includes the first transistor or the driver circuit includes the first transistor. The concentration defined in the present disclosure, if there're no special requirements, is the atomic concentration, that is, the atomic content per unit area.

Accordingly, the defects in the first insulating layer are repaired by setting both the first insulating layer and the second insulating layer to contain a small amount of hydrogen and by setting the concentration of hydrogen in the first insulating layer higher than the concentration of hydrogen in the second insulating layer, that is, by appropriately increasing the concentration of hydrogen in the first insulating layer. The diffusion of hydrogen to the second active layer is prevented by appropriately decreasing the concentration of hydrogen in the second insulating layer to avoid affecting the second active layer, thereby improving the stability of the second transistor and ensuring the good performance of the driver circuit.

Figure 2:
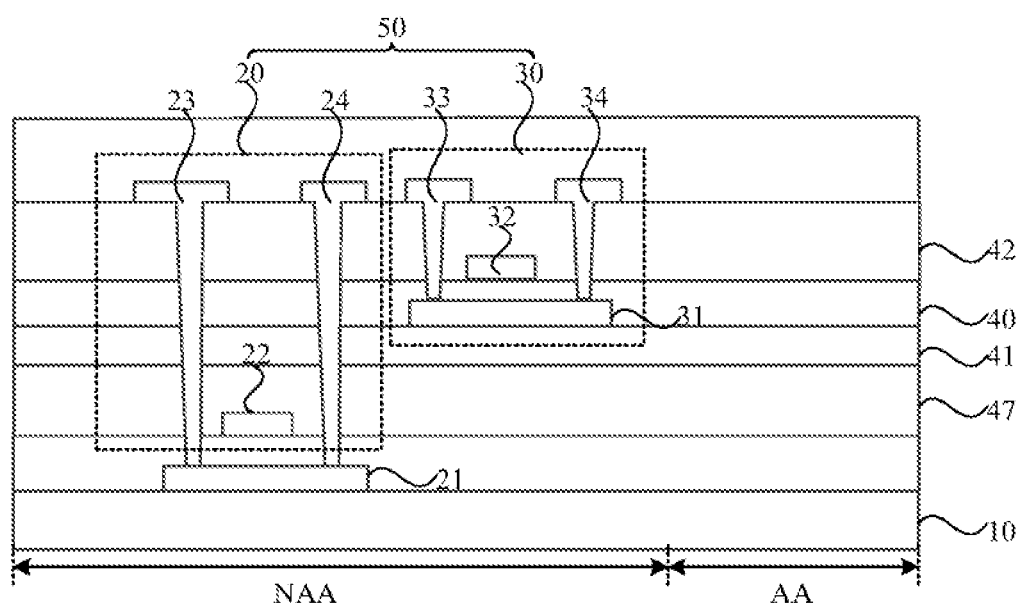
FIG. 2 is a structural diagram of another display panel provided by an embodiment of the present disclosure.

FIG. 2 is a structural diagram of a display panel provided by an embodiment of the present disclosure. As shown in FIG. 2, the display panel 100 includes, in part, a base substrate 10, a first transistor 20, a second transistor 30, a first insulating layer 40, and a second insulating layer 41.

The first transistor 20 and the second transistor 30 are formed on the base substrate 10. The first transistor 20 includes a first active layer 21, a first gate 22, a first source 23, and a first drain 24. The first active layer 21 includes silicon. The second transistor 30 includes a second active layer 31, a second gate 32, a second source 33, and a second drain 34. The second active layer 31 contains an oxide semiconductor and is located on a side of the first active layer 21 facing away from the base substrate 10. The first insulating layer 40 is located on a side of the second active layer 31 facing away from the base substrate 10 and between the second gate 32 and the second active layer 31. The second insulating layer 41 is located on a side of the second active layer 31 facing towards the base substrate 10. The concentration of hydrogen in the first insulating layer 40 is higher than the concentration of hydrogen in the second insulating layer 41. The display panel 100 includes a pixel circuit (not shown in FIG. 2) and a driver circuit 50 providing a driving signal for the pixel circuit. The driver circuit 50 includes at least one second transistor 30. FIG. 2 is illustrated by using an example in which the driver circuit 50 includes both the first transistor 20 and the second transistor 30.

Exemplarily, as shown in FIG. 2, the display panel 100 includes a display area AA and a non-display area NAA. The non-display area NAA is located on at least one side of the display area AA. FIG. 2 is illustrated by using an example in which the non-display area NAA is located on one side of the display area AA, where the driving circuit 50 is located in the non-display area NAA. The driver circuit 50 provides a driving signal for the pixel circuit (not shown in FIG. 2) in the display area AA to cause the pixel circuit to drive a light-emitting element which is located on the same subpixel as the pixel circuit to emit light, thereby implementing the display of the display panel 100. It is noted that the embodiment does not limit the specific structures of the driver circuit and the pixel circuit.

It is noted that in the present disclosure, the first transistor 20 and the second transistor 30 may be transistors in the driver circuit, that is, the driver circuit 50 includes the first transistor 20 or the second transistor 30; furthermore, the first transistor 20 and the second transistor 30 may be transistors in the pixel circuit, that is, the pixel circuit includes the first transistor 20 or the second transistor 30, for example, when the second transistor 30 is located in the pixel circuit, the second transistor 30 may be a drive transistor or a switch transistor.

Exemplarily, as shown in FIG. 2, the driver circuit 50 includes a first transistor 20 and a second transistor 30, where the first transistor 20 may be a bottom-gate transistor or a top-gate transistor. FIG. 2 is illustrated by using an example in which the first transistor 20 is a top-gate transistor, that is, the first gate 22 is located on a side of the first active layer 21 facing away from the base substrate 10. The second insulating layer 41 is located on a side of the first gate 22 facing away from the base substrate 10. The second active layer 31 is located on a side of the second insulating layer 41 facing away from the base substrate 10. The first insulating layer 40 is located on a side of the second active layer facing away from the substrate base substrate 10. The second gate 32 is located on a side of the first insulating layer 40 facing away from the base substrate 10. The first source 23, the first drain 24, the second source 33, and the second drain 34 are all located on a side of the second gate 32 facing away from the base substrate 10 and are provided insulatively from the second gate 32. The first source 23, the first drain 24, the second source 33, and the second drain 34 are provided in the same layer so that the process steps can be simplified. Furthermore, the first active layer 21 in the first transistor 20 contains silicon, which may be polysilicon, that is, the first active layer 21 is a polysilicon active layer such as an LTPS active layer. The second active layer 31 in the second transistor 30 includes an oxide semiconductor, that is, the second active layer 31 is an oxide semiconductor active layer such as an IGZO active layer. The LTPS thin-film transistor has the advantages of high carrier mobility, fast response, and low power consumption, and the oxide semiconductor transistor has the advantage of low leakage current. Therefore, when the driver circuit 50 includes both the first transistor 20 and the second transistor 30, the driver circuit 50 has the advantages of high carrier mobility, fast response, low power consumption, and low leakage current, thereby ensuring the good performance of the driver circuit 50 and improving the display performance of the display panel 100.

Furthermore, the first insulating layer 40 is an insulating layer located between the second gate 32 and the second active layer 31 and is generally made of silicon oxide. However, after the silicon oxide film is formed, the bonds of some oxygen atoms may be in a dandling state so that defects are formed, and these defects generate impacts such as trap sites that trap carriers in the second transistor 30, thereby affecting the stability of the second transistor 30. To remedy this problem, in the embodiment, the concentration of hydrogen in the first insulating layer 40 is set to a higher value than the concentration of hydrogen in the second insulating layer 41. In one aspect, the defects in the first insulating layer 40 are repaired by appropriately increasing the concentration of hydrogen in the first insulating layer 40, thereby preventing the defects in the first insulating layer 40 from generating impacts such as trapping carriers in the second transistor 30 and improving the pressure resistance of the first insulating layer 40. In another aspect, the redundancy of hydrogen and the diffusion of hydrogen to the second active layer 31 are avoided by appropriately decreasing the concentration of hydrogen in the second insulating layer 41 to avoid affecting the second active layer 31, thereby improving the stability of the second transistor 30 and ensuring the good performance of the driver circuit 50.

It is noted that since the first insulating layer 40 is located on the side of the second active layer 32 facing away from the base substrate 10 and between the second gate 32 and the second active layer and the second insulating layer 41 is located on the side of the second active layer facing towards the base substrate 10, the first insulating layer 40 and the second insulating layer 41 may directly be in contact with the second active layer 31, as shown in FIG. 1, or at least one of the first insulating layer 40 or the second insulating layer 41 may not be directly in contact with the second active layer 31. That is, without affecting the performance of the second transistor 30, at least one of the following conditions exists: other insulating layers are provided between the first insulating layer 40 and the second active layer 31, or other insulating layers are provided between the second insulating layer 41 and the second active layer 31, which is not specifically limited in the embodiment.

In an embodiment, the concentration of hydrogen in the first insulating layer 40 is C1, and the concentration of hydrogen in the second insulating layer 41 is C2, where $C1=n \times C2$, and where $1 < n < 5$. The concentration of hydrogen in the first insulating layer 40 and the concentration of hydrogen in the second insulating layer 41 are set to satisfy this relationship, thereby ensuring the stability of the second transistor 30.

In an exemplary embodiment, the concentration of hydrogen in the first insulating layer 40 is C1, and therefore $2 \times 10^{21}$ (atom/cm$^3$)$\leq C1 \leq 1 \times 10^{22}$ (atom/cm$^3$). The concentration of hydrogen in the first insulating layer 40 may be set between $2 \times 10^{21}$ (atom/cm$^3$) and $1 \times 10^{22}$ (atom/cm$^3$). That is, the concentration of hydrogen in the first insulating layer 40 is not too low to repair the defects inside the first insulating layer 40, and the concentration of hydrogen in the first insulating layer 40 is not too high to diffuse to the second active layer 31 and affect the second active layer 31 and thus affect the performance of the second transistor 30. Therefore, in the embodiment, the concentration C1 of hydrogen in the first insulating layer 40 is set to be $2 \times 10^{21}$ (atom/cm$^3$) $\leq C1 \leq 1 \times 10^{22}$ (atom/cm$^3$) so that the defects inside the first insulating layer 40 are repaired without affecting the second active layer 31, thereby improving the stability of the second transistor 30.

In an embodiment, the display panel 00 provided by the embodiment of the present disclosure further includes a third insulating layer 42. The third insulating layer 42 is located on a side of the second gate 32 facing away from the base substrate 10. The concentration of hydrogen in the third insulating layer 42 is lower than the concentration of hydrogen in the first insulating layer 40.

The second transistor 30 is sensitive to hydrogen. Although it has been mentioned above that the concentration of hydrogen in the first insulating layer 40 is higher than the concentration of hydrogen in the second insulating layer 41, the hydrogen in the first insulating layer 40 is only used for repairing the defects in the first insulating layer 40 to prevent the defects from causing impacts such as trapping on the carriers in the transistor, so the concentration thereof is very low. Accordingly, in one embodiment, the concentration of hydrogen in the third insulating layer 42 on a side of the second gate 32 facing away from the base substrate 10 is lower than the concentration of hydrogen in the first insulating layer 40, that is, the concentration of hydrogen in the third insulating layer 42 is lower. In this way, the second transistor 30 is protected by the third insulating layer 42 so that excessive hydrogen is prevented from entering the inside of the second transistor 30, avoiding affecting the performance of the second transistor 30.

In an embodiment, the concentration of hydrogen in the first insulating layer 40 is C1, the concentration of hydrogen in the second insulating layer 41 is C2, and the concentration of hydrogen in the third insulating layer 43 is C3, wherein $C1 \leq 2C2 - C3$.

Along the direction perpendicular to the base substrate 110, the first insulating layer 40 and the second insulating layer 41 are respectively located on both sides of the second gate 32 of the second transistor 30, that is, the first insulating layer 40 and the second insulating layer 41 are both gate insulating layers, and the bonds of some oxygen atoms may be in a dandling state after film formation, thereby forming defects and affecting the second transistor 30. Therefore, in the embodiment, C1 is set to less than or equal to $2C2-C3$, that is, $C1-C2 \leq C2-C3$, that is, although the concentration of hydrogen in the first insulating layer 40 is higher than the concentration of hydrogen in the second insulating layer 41, the difference between the concentration of hydrogen in the first insulating layer 40 and the concentration of hydrogen in the second insulating layer 41 is small. In this way, the defects inside the first insulating layer 40 are repaired by the hydrogen of the first insulating layer 40, and the defects inside the second insulating layer 41 are repaired by the hydrogen of the second insulating layer 41, thereby improving the stability of the second transistor 30 is improved.

Meanwhile, on the basis that the concentration of hydrogen in the second insulating layer 41 is lower than the concentration of hydrogen in the first insulating layer 40, the concentration of hydrogen in the second insulating layer 41 minus the concentration of hydrogen in the third insulating layer 42 is still greater than the difference between the concentration of hydrogen in the first insulating layer 40 and the concentration of hydrogen in the second insulating layer 41, which indicates that the hydrogen content of the third insulating layer 42 is lower. In this way, the second transistor 30 is protected by the third insulating layer 42 so that excessive hydrogen is prevented from entering the inside of the second transistor 30, avoiding affecting the performance of the second transistor 30.

Figure 3:
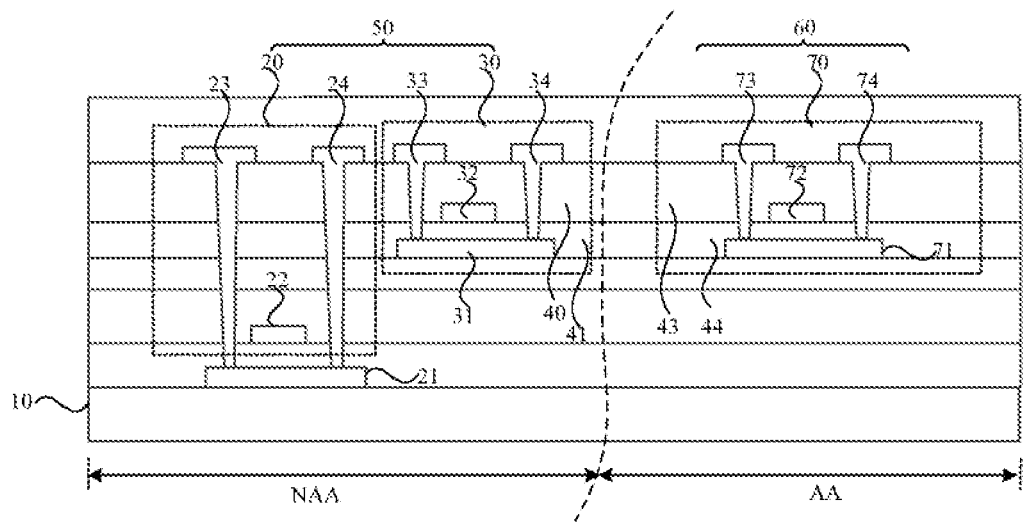
FIG. 3 is a structural diagram of another display panel provided by an embodiment of the present disclosure.

FIG. 3 is a structural diagram of a display panel according to an embodiment of the present disclosure. As shown in FIG. 3, the pixel circuit 60 includes a third transistor 70. The third transistor 70 includes a third active layer 71, a third source 73, a third drain 74, and a fourth gate 72, and the third active layer 71 contains an oxide semiconductor. The display panel 100 further includes a fourth insulating layer 43 and a fifth insulating layer 44. The fourth insulating layer 43 is located on a side of the third active layer 71 facing away from the base substrate 10 and between the third active layer 71 and the fourth gate 72. The fifth insulating layer 44 is located on a side of the third active layer 71 facing towards the base substrate 10. The concentration of hydrogen in the fourth insulating layer 43 is higher than the concentration of hydrogen in the fifth insulating layer 44.

Exemplarily, as shown in FIG. 3, the display panel 100 includes a display area AA and a non-display area NAA. The driver circuit 50 is located in the non-display area NAA, and the pixel circuit 60 is located in the display area AA. The pixel circuit 60 includes a third transistor 70. The third active layer 71 in the third transistor 70 includes an oxide semiconductor, that is, the third active layer 71 is an oxide semiconductor active layer such as an IGZO active layer. Since the leakage current of the oxide semiconductor thin-film transistor (TFT) is small, the leakage current in the working process of the pixel circuit 60 is small. Therefore, in such embodiments, both the second transistor 30 in the driver circuit 50 and the third transistor 70 in the pixel circuit 60 are set to be oxide semiconductor transistors. In this way, the driver circuit 50 and the pixel circuit 30 are ensured to perform well, thereby further improving the display performance of the display panel 100.

Furthermore, in such embodiments, the concentration of hydrogen in the fourth insulating layer 43 is set to be higher than the concentration of hydrogen in the fifth insulating layer 44. In one aspect, the defects in the fourth insulating layer 43 are repaired by appropriately increasing the concentration of hydrogen in the fourth insulating layer 43. In another aspect, the hydrogen is prevented from diffusing to the third active layer 71 by appropriately decreasing the concentration of hydrogen in the fifth insulating layer 44 to avoid affecting the third active layer 71, thereby improving the stability of the third transistor 70 and ensuring the good performance of the pixel circuit 60.

It is noted that the fourth insulating layer 43 may be disposed in the same layer as the first insulating layer 40, and the fifth insulating layer 44 may be disposed in the same layer as the second insulating layer 41; or the fourth insulating layer 43 may not be disposed in the same layer as the first insulating layer 40, and the fifth insulating layer 44 may not be disposed in the same layer as the second insulating layer 41. FIG. 3 illustrates an example in which the fourth insulating layer 43 is disposed in the same layer as the first insulating layer 40 and the fifth insulating layer 44 is disposed in the same layer as the second insulating layer 41. Furthermore, in the embodiment, the third source 73 and the third drain 74 in the third transistor 70 are disposed in the same layer as the second source 33 and the second drain 34 in the second transistor 30 and the first source 23 and the first drain 24 in the first transistor 20, thereby simplifying the process steps and improving the preparation efficiency of the display panel.

In an embodiment, the third transistor 70 is a switch transistor of the pixel circuit 60. The concentration of hydrogen in the first insulating layer 41 is higher than the concentration of hydrogen in the fourth insulating layer 43, that is, the concentration of hydrogen in the gate insulating layer of the second transistor 30 in the driver circuit 50 is higher than the concentration of hydrogen in the gate insulating layer of the third transistor 70 in the pixel circuit 60. Since the concentration of hydrogen in the gate insulating layer of the oxide semiconductor transistor would affect the state of the oxide semiconductor transistor when it is on and off, in a case where the oxide semiconductor transistor is used as an N-type transistor, when the concentration of hydrogen in the gate insulating layer is high and when the gate of the transistor receives a high-level signal, that is, when the transistor is on, the stability of the transistor is facilitated, and when the gate of the transistor receives a low-level signal, that is, when the transistor is off, the stability of the transistor is not facilitated. In the case where the display panel 100 may be applied to the scenario of low-frequency refresh, since the switch transistor in the pixel circuit 60 is kept off for a long time during the low-frequency refresh, in this embodiment, the concentration of hydrogen in the gate insulating layer in the switch transistor in the pixel circuit 60 is set to be low, while the concentration of hydrogen in the gate insulating layer in the second transistor 30 in the driver circuit 50 is set to be high because the transistor in the driver circuit 50 is kept on for a long time.

It is noted that when the first insulating layer 40 and the fourth insulating layer 43 are disposed in the same film layer, for example, different concentrations of hydrogen may be implanted into the first insulating layer 40 and the fourth insulating layer 43 by the ion implantation process so that the concentration of hydrogen in the first insulating layer 40 is higher than the concentration of hydrogen in the fourth insulating layer 43.

In an embodiment, the third transistor 70 is a drive transistor of the pixel circuit 60. The concentration of hydrogen in the first insulating layer 40 is lower than the concentration of hydrogen in the fourth insulating layer 43. That is, the concentration of hydrogen in the gate insulating layer of the second transistor 30 in the driver circuit 50 is lower than the concentration of hydrogen in the gate insulating layer of the third transistor 70 in the pixel circuit 60. Since the concentration of hydrogen in the gate insulating layer of the oxide semiconductor transistor would affect the state of the oxide semiconductor transistor when it is on and off, in a case where the oxide semiconductor transistor is used as an N-type transistor, when the concentration of hydrogen in the gate insulating layer is high and when the gate of the transistor receives a high-level signal, that is, when the transistor is on, the stability of the transistor is facilitated, and when the gate of the transistor receives a low-level signal, that is, when the transistor is off, the stability of the transistor is not facilitated. In the case where the display panel 100 may be applied to the scenario of low-frequency refresh, since the drive transistor in the pixel circuit 60 is kept on for a long time during the low-frequency refresh, in order to ensure the good stability, in this embodiment, the concentration of hydrogen in the gate insulating layer in the drive transistor in the pixel circuit 60 is set to be high.

Figure 4:
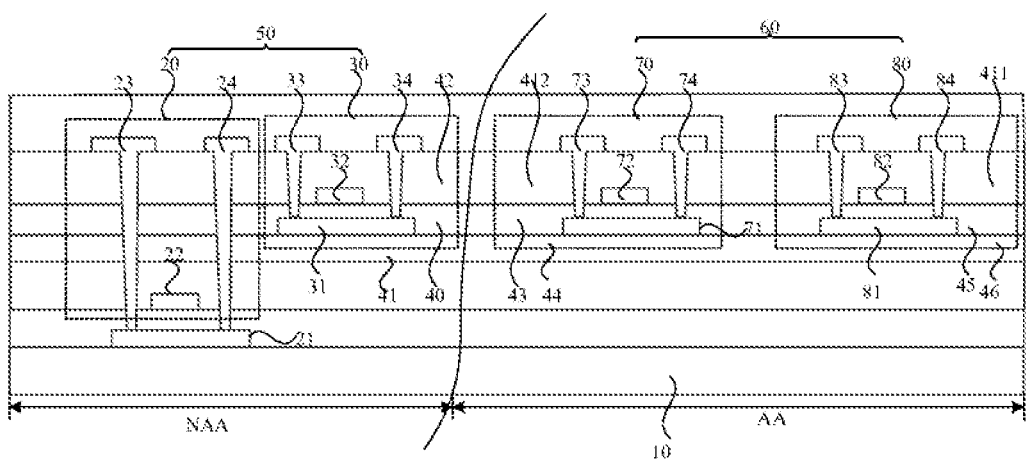
FIG. 4 is a structural diagram of another display panel provided by an embodiment of the present disclosure.

FIG. 4 is a structural diagram of a display panel according to an embodiment of the present disclosure. As shown in FIG. 4, the pixel circuit 60 includes a fourth transistor 80. The fourth transistor 80 includes a fourth active layer 81, a fourth source 83, a fourth drain 84, and a fifth gate 85. The fourth active layer 81 contains an oxide semiconductor. The display panel 100 further includes a sixth insulating layer 45 and a seventh insulating layer 46. The sixth insulating layer 45 is located on a side of the fourth active layer 81 facing away from the base substrate 10 and between the fourth active layer 81 and the fifth gate 85. The seventh insulating layer 46 is located on a side of the fourth active layer 81 facing towards the base substrate 10. The concentration of hydrogen in the sixth insulating layer 46 is higher than the concentration of hydrogen in the seventh insulating layer 46.

It is noted that the pixel circuit provided in the embodiment of the present disclosure may include two transistors (2T) or seven transistors (7T), and the specific structure of the pixel circuit 60 is not limited in the embodiments of the present disclosure. FIG. 4 illustrates two transistors.

In an embodiment, the pixel circuit 60 further includes a fourth transistor 80. The fourth active layer 81 in the fourth transistor 80 may also be an oxide semiconductor active layer such as an IGZO active layer. That is, the two transistors in the pixel transistor 60 in the embodiment are both oxide semiconductor transistors. Furthermore, in the embodiment, the concentration of hydrogen in the sixth insulating layer 45 is set to be higher than the concentration of hydrogen in the seventh insulating layer 46. In one aspect, the defects in the sixth insulating layer 45 are repaired by appropriately increasing the concentration of hydrogen in the sixth insulating layer 45. In another aspect, the hydrogen is prevented from diffusing to the fourth active layer 81 by appropriately decreasing the concentration of hydrogen in the seventh insulating layer 46 to avoid affecting the fourth active layer 81, thereby improving the stability of the fourth transistor 80 and ensuring the good performance of the pixel circuit 60.

The sixth insulating layer 45, the fourth insulating layer 43, and the first insulating layer 40 may be located in the same film layer or different film layers, or any two of the above layers may be located in the same film layer. Similarly, the seventh insulating layer 46, the fifth insulating layer 44, and the second insulating layer 41 may be located in the same film layer or different film layers, or any two of the above layers may be located in the same film layer. FIG. 4 is illustrated by using an example in which the sixth insulating layer 45, the fourth insulating layer 43, and the first insulating layer 40 are disposed in the same layer and the seventh insulating layer 46, the fifth insulating layer 44, and the second insulating layer 41 are disposed in the same layer. Furthermore, in the embodiment, the fourth source 83 and the fourth drain 84 in the fourth transistor 80 are disposed in the same layer as the third source 73 and the third drain 74 in the third transistor 70 and the second source 33 and the second drain 34 in the second transistor 30, thereby simplifying the process steps and improving the preparation efficiency of the display panel.

In an embodiment, the third transistor 70 is a drive transistor of the pixel circuit 60, and the fourth transistor is a switch transistor of the pixel circuit 60. The concentration of hydrogen in the fourth insulating layer 43 is higher than the concentration of hydrogen in the sixth insulating layer 45. Since the display panel 100 may be applied to the scenario of low-frequency refresh and the drive transistor in the pixel circuit 60 is kept on for a long time during the low-frequency refresh, in this embodiment, the concentration of hydrogen in the gate insulating layer in the drive transistor in the pixel circuit 60 is set to be high, thereby facilitating the stability of the third transistor 70.

When the sixth insulating layer 45 and the fourth insulating layer 43 are disposed in the same film layer, for example, different concentrations of hydrogen may be implanted into the sixth insulating layer 45 and the fourth insulating layer 43 by the ion implantation process so that the concentration of hydrogen in the fourth insulating layer 43 is higher than the concentration of hydrogen in the sixth insulating layer 45.

When the active layer of the transistor in the display panel 100 includes an oxide semiconductor, the concentration of hydrogen in the insulating layer near the active layer is set to be gradual so that the transistor including the oxide semiconductor active layer maintains good stability. The change of the concentration of hydrogen in the insulating layer near the second active layer 31 is illustrated below by using an example of the second transistor 30. It is to be understood that although the illustration is performed by using an example of the second transistor 30, when the third transistor 70 in the pixel circuit 60 is a transistor including the oxide semiconductor active layer and the fourth transistor 80 is a transistor including the oxide semiconductor active layer, the insulating layer near the third active layer 71 and the insulating layer near the fourth active layer 81 still satisfy such a relationship, which will not be described in detail in the following embodiment.

Referring to FIG. 2, in the first insulating layer 40, the concentration of hydrogen on a side near the second active layer 31 is lower than the concentration of hydrogen on a side away from the second active layer 31, and in the second insulating layer 41, the concentration of hydrogen on a side near the second active layer 31 is lower than the concentration of hydrogen on a side away from the second active layer 31. The advantage of the above setting is that the defects in the first insulating layer 40 and the second insulating layer 41 can be repaired by hydrogen to prevent the defects from causing impacts such as trapping on the carriers in the second transistor 30, and the hydrogen in the first insulating layer 40 and the second insulating layer 41 can be prevented from diffusing to the second active layer 31 to ensure that the second active layer 31 is not affected by excessive hydrogen.

In an embodiment, in the third insulating layer 42, the concentration of hydrogen on a side near the second gate 32 is lower than the concentration of hydrogen on a side away from the second gate 32. That is, the concentration of hydrogen of one side of the third insulating layer 42 close to the second gate 32 is set to be lower to ensure that the second transistor 30 has good stability.

Figure 5:
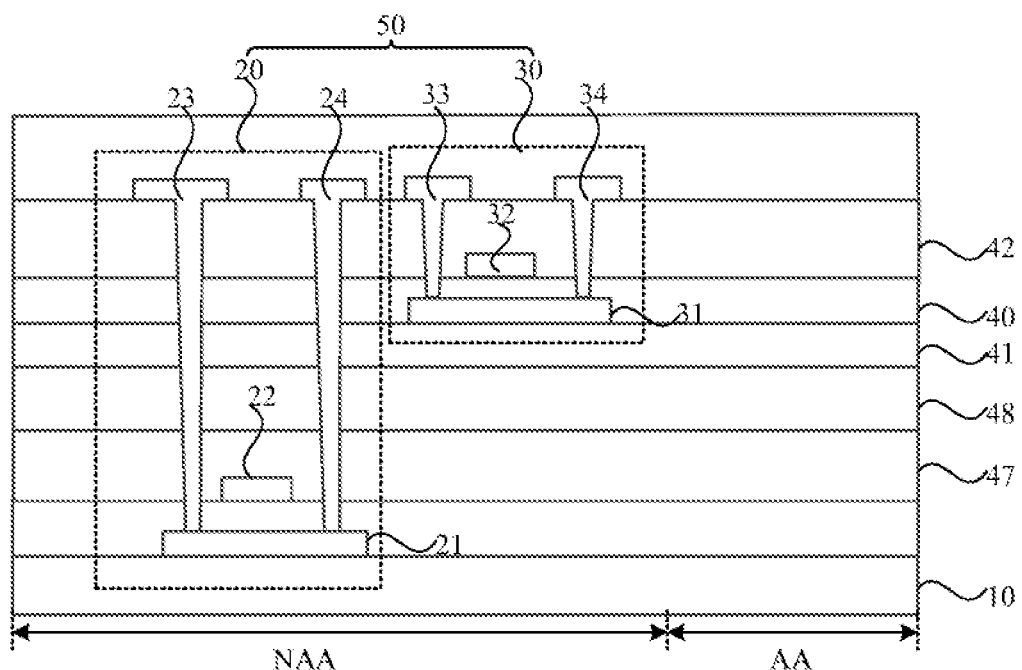
FIG. 5 is a structural diagram of another display panel provided by an embodiment of the present disclosure.

Referring to FIG. 2, the display panel 100 further includes an eighth insulating layer 47. The eighth insulating layer 47 is located between the first gate 22 and the second insulating layer 41. The concentration of hydrogen in the eighth insulating layer 47 is higher than the concentration of hydrogen in the second insulating layer 41. In this way, the defects in the first active layer 21 can be repaired by the hydrogen, and the hydrogen can be prevented from diffusing into the second active layer 31 to avoid affecting the second active layer 31. On the basis of this solution, in an embodiment, the display panel 100 provided in the embodiment of the present disclosure shown in FIG. 5 further includes a ninth insulating layer 48. The ninth insulating layer 48 is located between the second insulating layer 41 and the eighth insulating layer 47. The concentration of hydrogen in the ninth insulating layer 48 is lower than the concentration of hydrogen in the eighth insulating layer 47. In this embodiment, the ninth insulating layer 48 is set to be used as a transition insulating layer, that is, the concentrations of hydrogen in the ninth insulating layer 48, the eighth insulating layer 47, and the second insulating layer 41 gradually decrease to ensure that the hydrogen can repair the defects in the first active layer 21 and the hydrogen element can be prevented from diffusing into the second active layer 31 and affecting the second active layer 31. In an embodiment, along the direction in which the first active layer 21 points towards the second active layer 31, the concentrations of hydrogen in the eighth insulating layer 47 and the ninth insulating layer 48 decrease in a gradient manner, and the concentration of hydrogen in the ninth insulating layer 48 on a side near the eighth insulating layer 47 is lower than the concentration of hydrogen in the eighth insulating layer 47 on a side near the ninth insulating layer 48.

Figure 6:
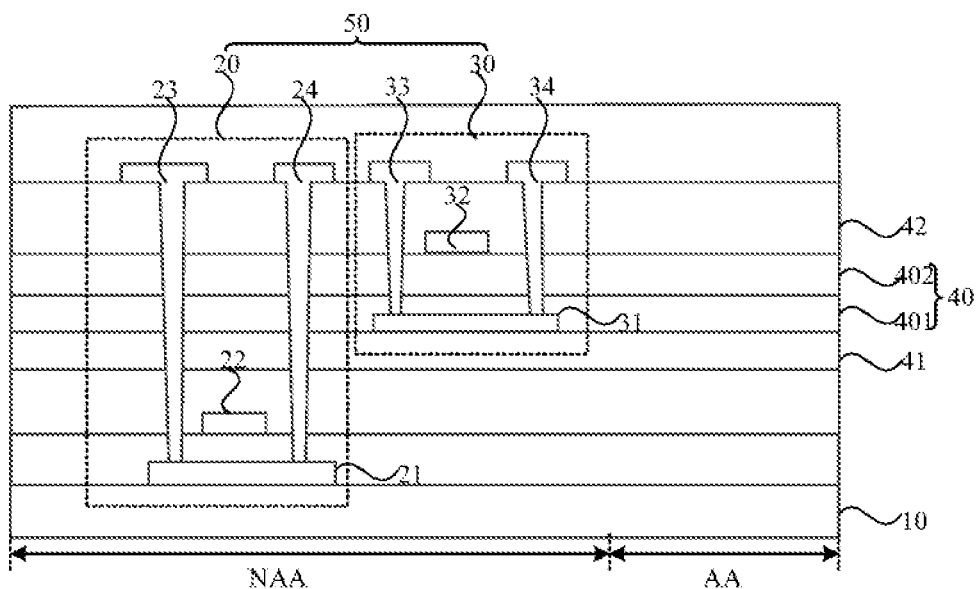
FIG. 6 is a structural diagram of another display panel provided by an embodiment of the present disclosure.

In one embodiment, the concentration of hydrogen in the same insulating layer is gradually changed along the direction perpendicular to the base substrate 10. In other embodiments, the multilayer insulating layer may also be provided, and the concentration of hydrogen in each insulating layer is the same, and the concentrations of hydrogen in the adjacent insulating layers are different, so as to achieve the effect of concentration gradual change. For example, FIG. 6 is a structural diagram of a display panel according to another embodiment of the present disclosure. As shown in FIG. 6, the first insulating layer 40 includes a first insulating sub-layer 401 and a second insulating sub-layer 402, where the first insulating sub-layer 401 is located on a side of the second insulating sub-layer 402 near the second active layer 31. The first insulating sub-layer 401 has a uniform hydrogen concentration. Similarly, the second insulating sub-layer 402 has a uniform hydrogen concentration. The concentration of hydrogen in the first insulating sub-layer 401 is lower than the concentration of hydrogen in the second insulating sub-layer 402 but higher than the concentration of hydrogen in the second insulating layer 41. The advantage of the above setting is that the defects in the first insulating sub-layer 401 and the second insulating sub-layer 402 can be repaired by hydrogen of the second insulating sub-layer 402 to prevent the defects from causing impacts such as trapping on the carriers in the second transistor 30, and since the concentration of hydrogen in the first insulating sub-layer 401 is low, the hydrogen can be prevented from diffusing to the second active layer 31 to ensure that the second active layer 31 is not affected by the hydrogen. Since the concentration of hydrogen in the first insulating sub-layer 401 is higher than the concentration of hydrogen in the second insulating sub-layer 402, the hydrogen in the second insulating sub-layer 402 is prevented from diffusing to the second active layer 31, further ensuring that the second active layer 31 is not affected by the hydrogen. It is to be noted that other insulating layers may also be set in this way, which will not be described in detail herein.

The following is a description of how to improve the performance of each transistor in at least one of the driver circuit or the pixel circuit by adjusting the concentration of oxygen or the number of oxygen atoms in the insulating layer.

In an embodiment, the first insulating layer 40 includes silicon oxide $SiO_x$, and the second insulating layer 41 includes silicon oxide $SiO_y$, where x is the ratio of the number of oxygen to the number of silicon in the first insulating layer 40, y is the ratio of the number of oxygen to the number of silicon in the second insulating layer 41, and $x<y$.

Exemplarily, the materials of the first insulating layer 40 and the second insulating layer 41 both include silicon oxide. However, since the first insulating layer 40 is an insulating layer of the second gate 32, the defects in the first insulating layer 40 are repaired by appropriately increasing the concentration of hydrogen in the first insulating layer 40, and since the second insulating layer 41 is an insulating layer near the second active layer 32, the sufficient oxygen is supplied to the second active layer 32 by appropriately increasing the concentration of oxygen to ensure the good performance of the second transistor 30. In an embodiment, the concentration of oxygen in the first insulating layer 40 is lower than the concentration of oxygen in the second insulating layer 41.

In the embodiment, in the first insulating layer 40, the concentration of oxygen is appropriately decreased, and the concentration of hydrogen is appropriately increased. In this way, even if the first insulating layer 40 is silicon oxide and there are dandling bonds in the oxygen atoms of the silicon oxide after film formation to form defects, there are few cases where there are dangling bonds in the oxygen atom since the concentration of oxygen in the first insulating layer 40 is low, and even if there is, the defects in the first insulating layer 40 can be repaired by the hydrogen in the first insulating layer 40. Moreover, the oxygen in the second insulating layer 41 is appropriately increased, and more oxygen is supplied to the second active layer 31 through the oxygen in the second insulating layer 41 to further improve the stability of the second transistor 30.

In an embodiment, the ratio of the concentration of oxygen to the concentration of silicon in the first insulating layer 40 is A, and the ratio of the concentration of oxygen to the concentration of silicon in the second insulating layer 41 is B, where $A<B$.

In the embodiment, when the first insulating layer 40 and the second insulating layer 41 both include oxygen and silicon, the concentration of oxygen in the first insulating layer 40 is appropriately decreased to reduce the presence of dangling bonds in the oxygen atoms; the oxygen in the second insulating layer 41 is appropriately increased to supply more oxygen element to the second active layer 31 through the oxygen in the second insulating layer 41, thereby improving the stability of the second transistor 30.

In an embodiment, the ratio of the concentration of oxygen to the concentration of silicon in the first insulating layer 40 is A, the ratio of the concentration of oxygen to the concentration of silicon in the second insulating layer 41 is B, the concentration of hydrogen in the first insulating layer 40 is C1, and the concentration of hydrogen in the second insulating layer 42 is C2, where $C1 \times (A-1) \leq C2 \times (B-1)$, that is, $(A-1)/(B-1) \leq C2/C1$. In other words, in the first insulating layer 40 and the second insulating layer 41, the change in the oxygen-silicon ratio is large, and the change in the concentration of hydrogen is small. In this way, the concentration of oxygen in the first insulating layer 40 is low to reduce the presence of dangling bonds in the oxygen atoms; the oxygen in the second insulating layer 41 is appropriately increased to supply more oxygen to the second active layer 31 through the oxygen in the second insulating layer 41; moreover, the concentration of oxygen in the first insulating layer 40 is low, the concentration of oxygen in the second insulating layer 41 is appropriately increased, the concentration of hydrogen in the first insulating layer 40 is appropriately increased within a reasonable range, and thus the stability of the second transistor 30 is improved through the above comprehensive regulation.

In an embodiment, the concentration of oxygen to the concentration of silicon in the third insulating layer 42 is C, where A<C<B. The concentration of oxygen in the third insulating layer 42 is set to be higher than the concentration of oxygen in the first insulating layer 40 to protect the second transistor 30.

In an embodiment, the concentration of hydrogen in the third insulating layer 42 is C3, where C2×(C−1)≥C3×(B−1), that is, (C−1)/(B−1)≥C3/C2. In other words, in the third insulating layer 42 and the second insulating layer 41, the reduction in the concentration of hydrogen is larger than that of the silicon oxide ratio to protect the second transistor 30 through the third insulating layer 42 with a low hydrogen concentration.

It is understood that although the above example is illustrated with the setting of concentration of oxygen in the first insulating layer 41, the second insulating layer 42, and the third insulating layer 43 in the vicinity of the second transistor 30, when the display panel 100 further includes the third transistor 70 and the fourth transistor 80 as shown, for example, with reference to FIG. 4, the above-described rule is also applicable to the fourth insulating layer 43, the fifth insulating layer 44, and the insulating layer 412 on the side of the fourth insulating layer 43 facing away from the fifth insulating layer 44, and the above-described rule is also applicable to the sixth insulating layer 45, the seventh insulating layer 46, and the insulating layer 411 on the side of the sixth insulating layer 45 facing away from the seventh insulating layer 46.

The above embodiments are illustrated by using an example in which the second transistor 30 is a top-gate transistor. In an embodiment, the second transistor 30 may also be a double-gate transistor. When the second transistor 30 is a double-gate transistor, in addition to satisfying the rule of the concentration of hydrogen in the insulating layer described in the above embodiments, the second transistor 30 may also be individually set according to the characteristics of the double-gate transistor.

Figure 7:
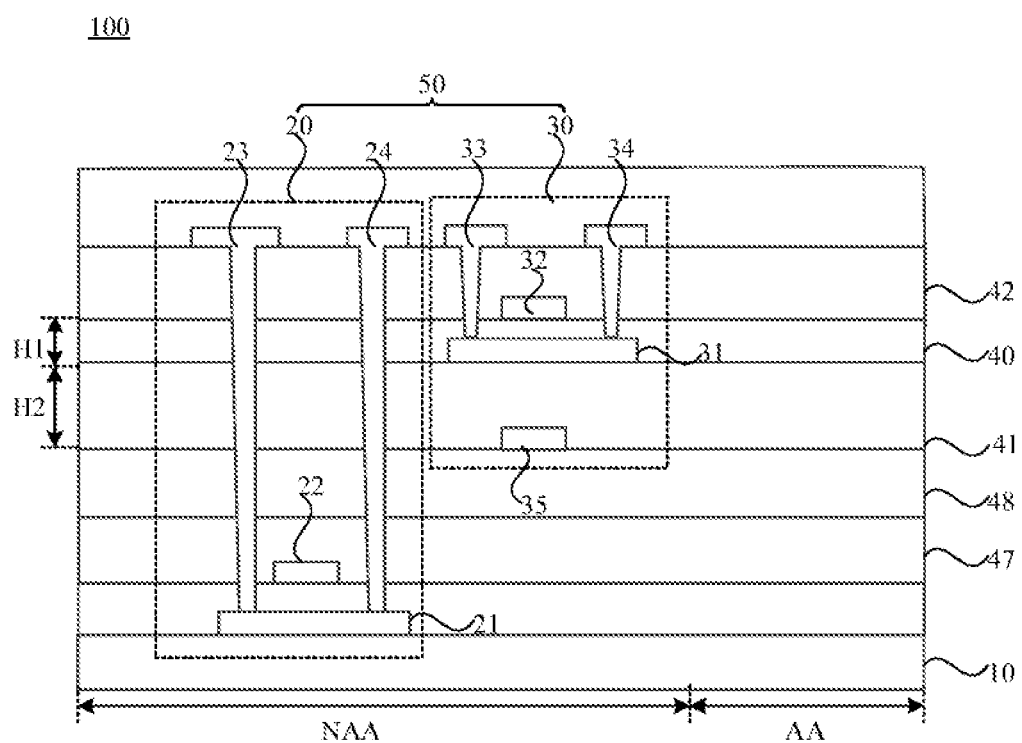
FIG. 7 is a structural diagram of another display panel provided by an embodiment of the present disclosure.

FIG. 7 is a structural diagram of a display panel according to another embodiment of the present disclosure. As shown in FIG. 7, The second transistor 30 includes a third gate 35 located on a side of the second insulating layer 41 facing towards the base substrate 10, where the concentration of hydrogen in the third insulating layer 42 is lower than or equal to the concentration of hydrogen in the second insulating layer 41.

In an embodiment, the second transistor 30 includes both the second gate 32 and the third gate 35, that is, the second transistor 30 is a double-gate transistor. In this way, the mobility of carriers in the second transistor 30 can be enhanced to enhance the responsiveness of the second transistor 30. On the basis of this, the size of the second transistor 30 may be appropriately reduced to reduce the area of the non-display area NAA where the driver circuit 50 is located, thereby achieving frame narrowing of the display panel 100. Furthermore, when the second transistor 30 includes the third gate 35, the bonds of some oxygen atoms of the second insulating layer 41 between the second active layer 31 and the third gate 32 may be in a dandling state to cause defects, which may generate impacts such as trapping on carriers in the transistor 30, thereby affecting the stability of the second transistor 30. In the embodiment, the concentration of hydrogen in the second insulating layer 41 is set to be higher than the concentration of hydrogen in the third insulating layer 42. In one aspect, the hydrogen in the second insulating layer 41 is prevented from affecting the second active layer 31. In another aspect, the defects in the second insulating layer 41 are repaired by appropriate hydrogen. The third insulating layer 42 protects the second transistor 30, thereby improving the stability of the third transistor 30.

On the basis of the above solution, with continued reference to FIG. 7, in an embodiment, the thickness H1 of the first insulating layer 40 is less than the thickness H2 of the second insulating layer 41. When the second transistor 30 is a double-gate transistor, the second gate 32 is the main gate of the second transistor 30, and the third gate 35 is the auxiliary gate of the second transistor 30. The thickness of the first insulating layer 40 corresponding to the main gate is set to be less than the thickness of the second insulating layer 41 corresponding to the auxiliary gate to ensure the control capability of the main gate to the second transistor 30.

When the second transistor 30 is a double-gate transistor, in an embodiment, the first insulating layer 40 includes silicon oxide $SiO_x$, and the second insulating layer 41 includes silicon oxide $SiO_y$, where x is the ratio of the number of oxygen to the number of silicon in the first insulating layer 40, y is the ratio of the number of oxygen to the number of silicon in the second insulating layer 41, and x<y. That is, since the first insulating layer 40 is the insulating layer of the main gate (the second gate 32), the defects in the first insulating layer 40 are repaired by appropriately increasing the concentration of hydrogen in the first insulating layer 40, and since the second insulating layer 41 is the insulating layer of the auxiliary gate (the third gate 35), the sufficient oxygen is supplied to the second active layer 32 by appropriately increasing the concentration of oxygen to ensure the good performance of the second transistor 30.

It is understood that in FIG. 7, when the second transistor 30 is a double-gate transistor, the relationship between the thickness H1 of the first insulating layer 40 and the thickness H2 of the second insulating layer 41 is described, and when the materials of the first insulating layer 40 and the second insulating layer 41 are both silicon oxide, the ratio of the number of oxygen atoms to the number of silicon atoms in the first insulating layer 40 and the ratio of the number of oxygen atoms to the number of silicon atoms in the second insulating layer 41 are defined. It is to be understood that when the third transistor 70 is a double-gate transistor, the fourth insulating layer 43 and the fifth insulating layer 44 also satisfy the above relationship; when the fourth transistor 80 is a double-gate transistor, the sixth insulating layer 45 and the seventh insulating layer 46 also satisfy the above relationship.

Figure 8:
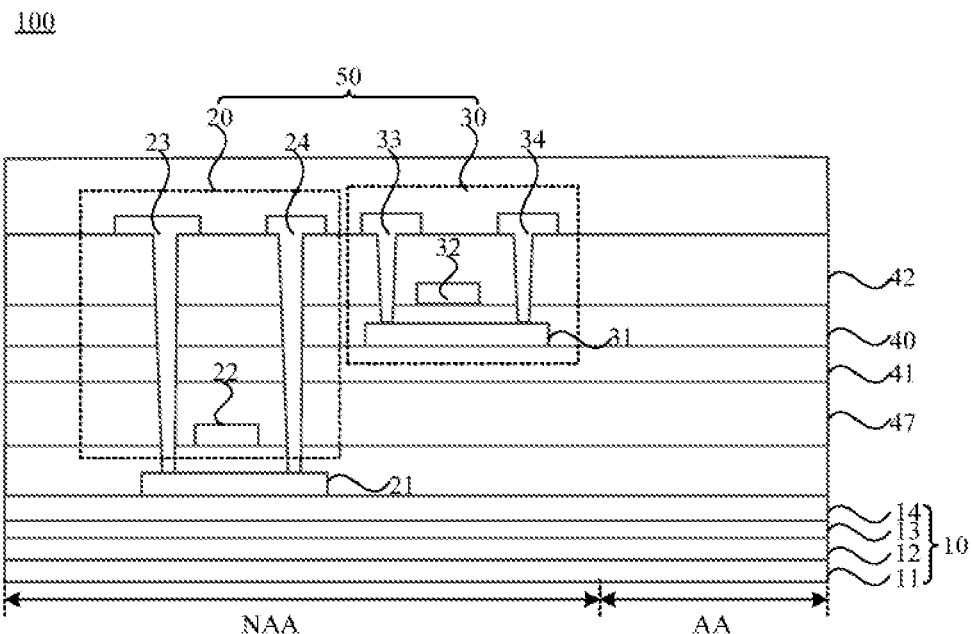
FIG. 8 is a structural diagram of another display panel provided by an embodiment of the present disclosure.

In an embodiment, the base substrate 10 may be a flexible base substrate or a rigid base substrate, which is not limited in the embodiments of the present disclosure. When the base substrate 10 is a flexible substrate, the base substrate 10 may include a polyimide substrate to ensure that the flexible substrate has good high temperature resistance and good insulation performance. The base substrate 10 may include one layer of polyimide substrate or two layers of polyimide substrate, which is not limited in the embodiments of the present disclosure. When the substrate substrate 10 includes a layer of polyimide substrate, the film layer of the base substrate 10 has a simple structure and can be prepared with a simple process, facilitating the implementation of the design requirements of lightening and thinning of the base substrate 10 and the entire display panel. When the base substrate 10 includes at least two layers of polyimide substrate, a buffer layer is further provided between the polyimide substrates to enhance adhesion between the polyimide substrates and to avoid the influence of some impurities in the substrates on the first active layer 21. Furthermore, since the polyimide substrate is generally prepared on a rigid substrate, after the driver circuit 50, the pixel circuit, and the light-emitting element are prepared on the base substrate 10, the rigid substrate is generally lift off by the laser lift-off technique, but the polyimide substrate may be damaged when the rigid substrate is lifted off by laser. Therefore, when the base substrate 10 includes at least two layers of polyimide substrate, for example, including a first polyimide substrate and a second polyimide substrate, a first buffer layer is provided between the first polyimide substrate and the second polyimide substrate, and a second buffer layer is provided between the second polyimide substrate and the first active layer 21. The first polyimide substrate is prepared on the rigid substrate, and the driver circuit 50 and the pixel circuit are prepared on the second buffer layer. Therefore, even though the first polyimide substrate may be damaged when the rigid substrate is lifted off by laser, the integrity of the second polyimide substrate and the integrity of the second buffer layer on the second polyimide substrate can be maintained, thereby maintaining the integrity of the entire display panel. For example, with reference to FIG. 8, the base substrate 10 is illustrated by using an example in which the base substrate 10 is a flexible substrate, in which the base substrate 10 includes the first flexible substrate 11 and the second flexible substrate 13, which are polyimides, respectively, as well as the first buffer layer 12 between the first flexible substrate 11 and the second flexible substrate 13 and the second buffer layer 14 between the second flexible substrate 13 and the first active layer 21.

Figure 9:
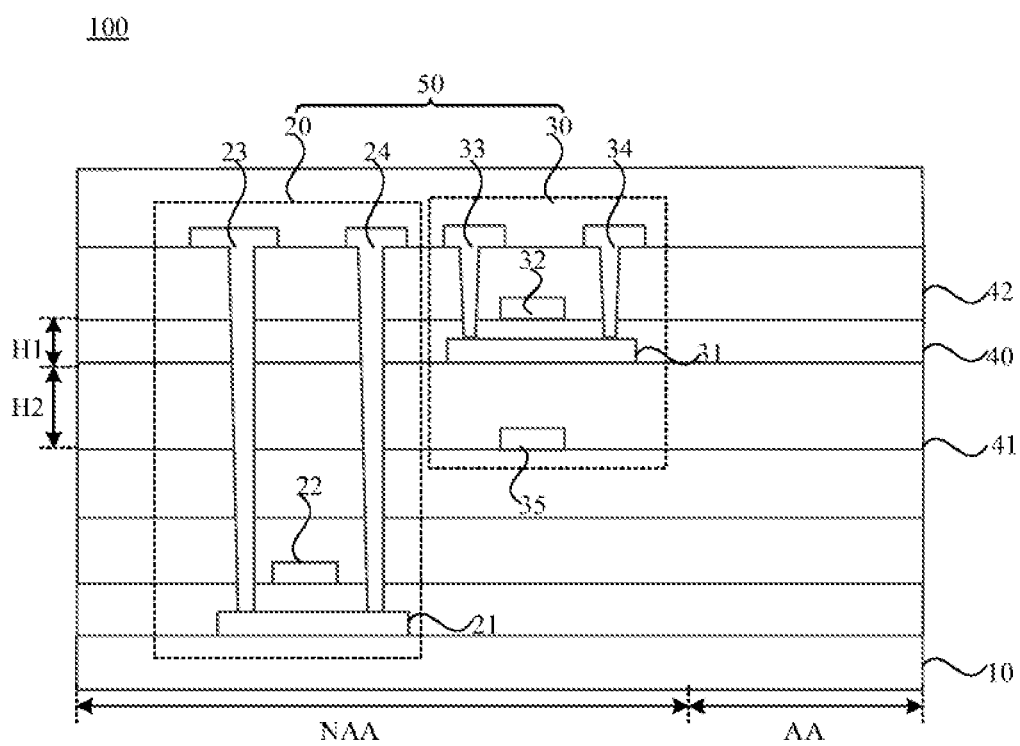
FIG. 9 is a structural diagram of another display panel provided by an embodiment of the present disclosure.

Embodiments of the present disclosure equally apply to a display panel. FIG. 9 is a structural diagram of a display panel according to another embodiment of the present disclosure. As shown in FIG. 9, the display panel 100, in accordance with embodiments of the present disclosure, includes a base substrate 10, a first transistor 20, a second transistor 30, a first insulating layer 40, and a second insulating layer 41. The first transistor 20 and the second transistor 30 are formed on the base substrate 10. The first transistor 20 includes a first active layer 21, a first gate 22, a first source 23, and a first drain 24. The first active layer 21 contains silicon. The second transistor 30 includes a second active layer 31, a second gate 32, a second source 33, and a second drain 34. The second active layer 31 contains an oxide semiconductor and is located on a side of the first active layer 21 facing away from the base substrate 10. The first insulating layer 40 and the second insulating layer 42 are located on both sides of the second active layer 31, respectively. The first insulating layer 40 is located between the second gate 32 and the second active layer 31. The second insulating layer 41 is located between the second gate 32 and the second active layer 31. The thickness of the first insulating layer 40 is less than the thickness of the second insulating layer 41. The concentration of hydrogen in the first insulating layer 40 is higher than the concentration of hydrogen in the second insulating layer 41. The display panel 100 includes a pixel circuit (not shown in FIG. 9) and a driver circuit 50 providing a driving signal for the pixel circuit. The driver circuit 50 includes a second transistor 30. The pixel circuit includes a first transistor 20 or the driver circuit 50 includes a first transistor 20. FIG. 9 is illustrated by using an example in which the driver circuit includes the first transistor 20.

Exemplarily, with continued reference to FIG. 9, when the second gate 32 is the main gate of the second transistor 30 and is the top gate of the second transistor 30, the thickness H1 of the first insulating layer 40 corresponding to the main gate is set to be less than the thickness H2 of the second insulating layer 41 corresponding to the auxiliary gate, thereby ensuring the control capability of the main gate to the second transistor 30.

Figure 10:
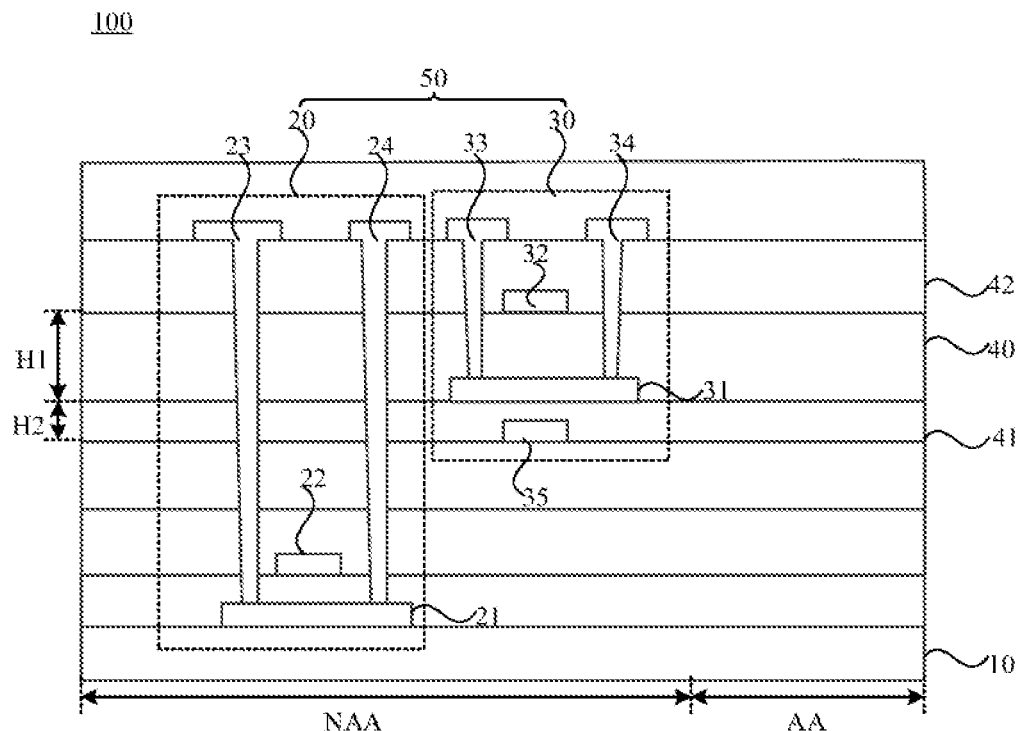
FIG. 10 is a structural diagram of another display panel provided by an embodiment of the present disclosure.

FIG. 10 is a structural diagram of a display panel according to an embodiment of the present disclosure. As shown in FIG. 10, when the second gate 32 is the main gate of the second transistor 30 and is the bottom gate of the second transistor 30, the thickness of the first insulating layer 40 corresponding to the main gate is set to be less than the thickness of the second insulating layer 41 corresponding to the auxiliary gate to ensure the control capability of the main gate to the second transistor 30.

In the display panel provided by the embodiment of the present disclosure, the concentration of hydrogen of the first insulating layer (that is, the insulating layer of the main gate) is higher than the concentration of hydrogen of the second insulating layer (that is, the insulating layer of the auxiliary gate), that is, the concentration of hydrogen of the first insulating layer is appropriately increased, to facilitate the repair of the defects in the first insulating layer. The concentration of hydrogen in the second insulating layer is appropriately deceased to prevent the hydrogen from diffusing to the second active layer, thereby avoiding affecting the second transistor, improving the stability of the second transistor, and ensuring good performance of the driver circuit. Meanwhile, the thickness of the first insulating layer (that is, the insulating layer of the main gate) is set to be less than the thickness of the second insulating layer (that is, the insulating layer of the auxiliary gate) to ensure the control ability of the main gate to the second transistor.

Figure 11:
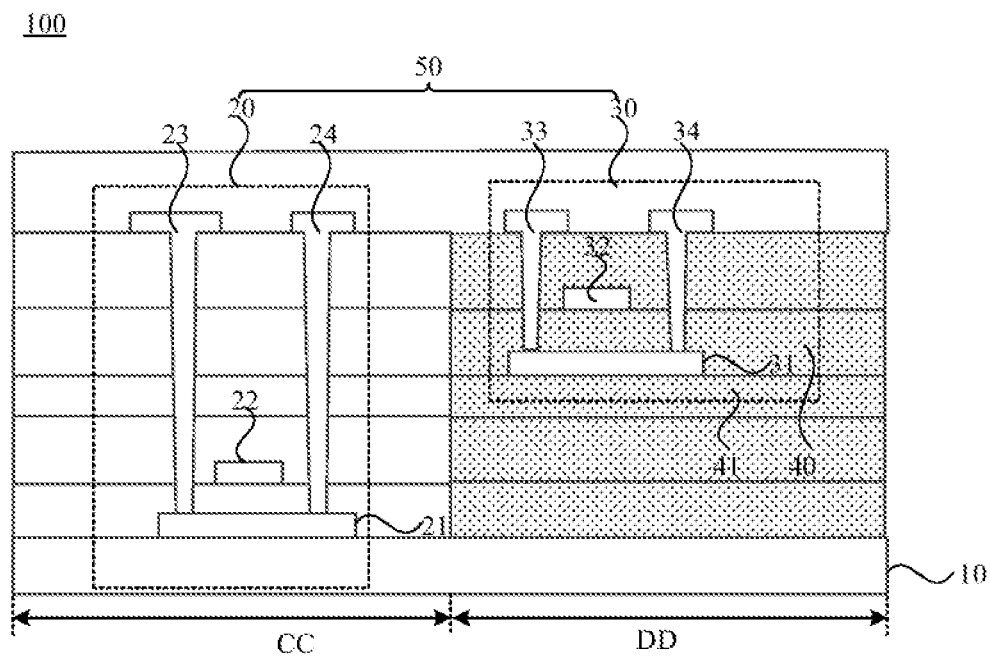
FIG. 11 is a structural diagram of another display panel provided by an embodiment of the present disclosure.

The base substrate 10 includes a first area CC and a second area DD. FIG. 11 is a structural diagram of another display panel provided by an embodiment of the present disclosure. As shown in FIG. 11, the display panel 100 provided by the embodiment of the present disclosure includes a base substrate 10, a first transistor 20, a second transistor 30, a first insulating layer 40, and a second insulating layer 41. The first transistor 20 and the second transistor 30 are formed on the base substrate 10. The first transistor 20 is located in the first area CC, and the second transistor 30 is located in the second area DD. The first transistor 20 includes a first active layer 21, a first gate 22, a first source 23, and a first drain 24. The first active layer contains silicon, which may be polysilicon, that is, the first active layer 21 is a polysilicon active layer such as an LTPS active layer. The second transistor 30 includes a second active layer 31, a second gate 32, a second source 33, and a second drain 34. The second active layer 31 contains an oxide semiconductor, that is, the second active layer 31 is an oxide semiconductor active layer such as an IGZO active layer. The second active layer 31 is located on a side of the first active layer 21 facing away from the base substrate 10. The first insulating layer 40 is located on a side of the second active layer 31 facing away from the base substrate 10 and between the second gate 32 and the second active layer 31. The second insulating layer 41 is located on a side of the second active layer 31 facing towards the base substrate 10. The concentration of hydrogen in the first insulating layer 40 is higher than the concentration of hydrogen in the second insulating layer 41. The display panel 100 includes a pixel circuit (not shown in FIG. 11) and a driver circuit 50 providing a driving signal for the pixel circuit. The driver circuit 50 includes at least one second transistor 30. FIG. 11 is illustrated by using an example in which the driver circuit 50 includes both the first transistor 20 and the second transistor 30. The concentration of hydrogen in the first area CC is higher than the concentration of hydrogen in the second area DD, and the concentration of oxygen in the second area DD is higher than the concentration of oxygen in the first area CC.

In the embodiment, the concentration of hydrogen of the first insulating layer 40 is set to be higher than the concentration of hydrogen of the second insulating layer 41, that is, the concentration of hydrogen of the first insulating layer 40 is appropriately increased, to facilitate the repair of defects in the first insulating layer 40. The concentration of hydrogen in the second insulating layer 41 is appropriately deceased to prevent the hydrogen from diffusing to the second active layer 31, thereby avoiding affecting the second transistor 30, improving the stability of the second transistor 30, and ensuring the good performance of the driver circuit 50. Furthermore, the concentration of hydrogen in the first area CC including the second transistor is set to be appropriately increased so that the hydrogen repairs the defects in the first active layer 21 to ensure the good performance of the first transistor 20. Meanwhile, the concentration of hydrogen in the second area DD is set to be decreased to prevent excessive hydrogen from affecting the second active layer 31 and thus affecting the performance of the second transistor 30. Furthermore, the concentration of oxygen of the second area DD including the second transistor 30 is set to be appropriately increased so as to supply sufficient oxygen to the second active layer 32 to ensure the good performance of the second transistor 30.

Figure 12:
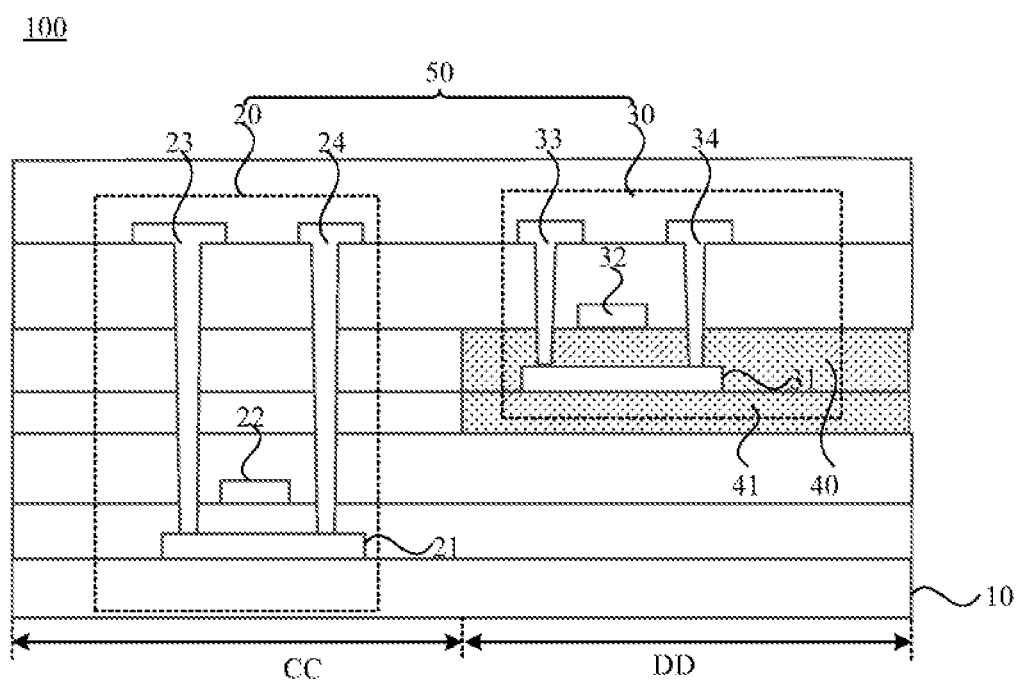
FIG. 12 is a structural diagram of another display panel provided by an embodiment of the present disclosure.

It is noted that FIG. 11 illustrates an example in which the concentration of oxygen in each film layer in the second area DD is appropriately increased to supply sufficient oxygen to the second active layer 32. In other implementations, the concentration of oxygen of only part of the film layers may be set to be appropriately increased to supply sufficient oxygen to the second active layer 32. For example, with reference to FIG. 12, only the concentration of oxygen of the first insulating layer 40 and the second insulating layer 41 are both appropriately increased to supply sufficient oxygen to the second active layer 32. In other words, the concentration of hydrogen of the first insulating layer 40 is set to be higher than the concentration of hydrogen of the second insulating layer 41, that is, the concentration of hydrogen of the first insulating layer 40 is appropriately increased, to facilitate the repair of defects in the first insulating layer 40. The concentration of hydrogen in the second insulating layer 41 is appropriately deceased to prevent the hydrogen from diffusing to the second active layer 31 and affecting the second transistor 30, thereby improving the stability of the second transistor 30, and ensuring the good performance of the driver circuit 50. Meanwhile, the concentration of oxygen in both the first insulating layer 40 and the second insulating layer 41 are appropriately increased to supply sufficient oxygen to the second active layer 32, further ensuring the good performance of the driver circuit 50.

It is to be noted that, for example, the ion implantation process may be adopted, that is, the ion implantation process may be adopted to enable the concentration of hydrogen and the concentration of oxygen in different areas to be different.

Since the setting may be made for a specific area, that is, the second area DD including the second transistor 30 may be set to be an oxygen-rich area, so that even if the concentration of hydrogen in the first area CC is increased, the hydrogen does not affect the second active layer 31.

Figure 13:
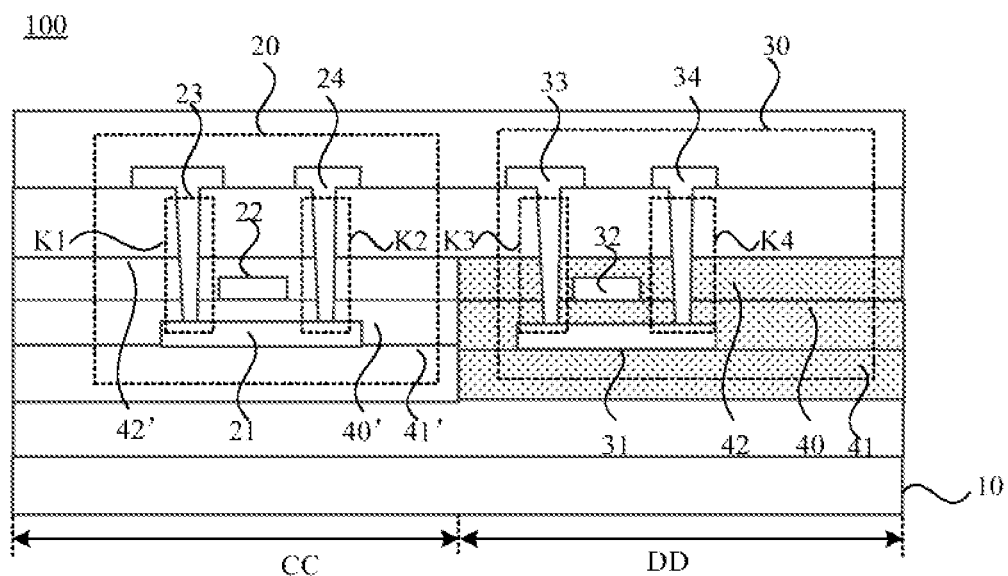
FIG. 13 is a structural diagram of another display panel provided by an embodiment of the present disclosure.

Therefore, with reference to FIG. 13, the second active layer 31 and the first active layer 21 may be disposed in the same film layer, and the first gate 22 and the second gate 32 are located in the same film layer, so that the thickness of the insulating layer can be reduced, thereby reducing the thickness of the display panel 100.

With continued reference to FIG. 13, the first source 23, the first drain 24, the second source 33, and the second drain 34 are located in the same film layer. The first source 23 is electrically connected to the first active layer 21 through the first via K1. The first drain electrode 24 is electrically connected to the first active layer 21 through the second via K2. The second source 33 is electrically connected to the second active layer 31 through a third via K3. The second drain 34 is electrically connected to the second active layer 31 through the fourth via K4. As the thickness of the insulating layer decreases, the depths of the first via K1, the second via K2, the third via K3, and the fourth via K4 decrease, thereby avoiding deep drilling and reducing the difficulty of drilling.

With continued reference to FIG. 13, the second area DD further includes a third insulating layer 42 located on a side of the second gate 32 facing away from the base substrate 10. It is to be noted that on the basis that the second region DD is an oxygen-enriched region, in the foregoing description, the relationship of the hydrogen concentration of the first insulating layer 40, the second insulating layer 41, and the third insulating layer 42 and the relationship of the oxygen concentration in the first insulating layer 40, the second insulating layer 41, and the third insulating layer 42 are all applicable to this solution, which will not be described in detail herein.

Figure 14:
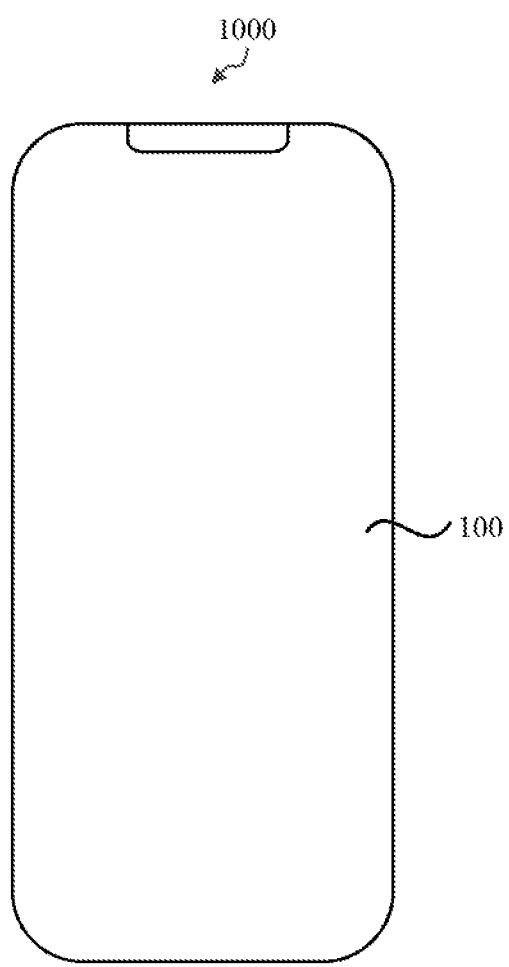
FIG. 14 is a structural diagram of a display device provided by an embodiment of the present disclosure.

A display device, in accordance with embodiments of the present disclosure, further includes any display panel provided in the embodiments described above. Exemplarily, with reference to FIG. 14, the display device 1000 includes the display panel 100. Therefore, the display device also has the beneficial effects of the display panel described in the embodiments described above, and for the same details, reference may be made to the description of the display panel, which will not be repeated herein.

The display device 1000 provided in the embodiments of the present disclosure may be the phone shown in FIG. 100, or may be any electronic product with a display function, including but not limited to: televisions, laptops, desktop displays, tablet computers, digital cameras, smart bracelets, smart glasses, in-vehicle displays, industry-controlling equipment, medical displays, touch interactive terminals, etc., which will not be no specifically limited in the embodiments of the present disclosure.

It is to be noted that the preceding are only preferred embodiments of the present disclosure and the technical principles used therein. It is to be understood by those skilled in the art that the present disclosure is not limited to the embodiments described herein. Those skilled in the art can make various apparent modifications, adaptations, and substitutions without departing from the scope of the present disclosure. Therefore, while the present disclosure has been described in detail via the preceding embodiments, the present disclosure is not limited to the preceding embodiments and may include equivalent embodiments without departing from the concept of the present disclosure. The scope of the present disclosure is determined by the scope of the appended claims.

What is claimed is:

1. A display panel, comprising:
a base substrate;
a first transistor and a second transistor, wherein the first transistor and the second transistor are formed on the base substrate, wherein the first transistor comprises a first active layer, a first gate, a first source, and a first drain, wherein the first active layer comprises silicon, wherein the second transistor comprises a second active layer, a second gate, a third gate, a second source, and a second drain, and wherein the second active layer comprises an oxide semiconductor, and wherein the second active layer is located on a side of the first active layer facing away from the base substrate; and
a first insulating layer and a second insulating layer, wherein the first insulating layer and the second insulating layer are located on both sides of the second active layer, wherein the first insulating layer is located between the second gate and the second active layer, wherein the second insulating layer is located between the third gate and the second active layer, and wherein a thickness of the first insulating layer is less than a thickness of the second insulating layer,
wherein a concentration of hydrogen in the first insulating layer is higher than a concentration of hydrogen in the second insulating layer; and
wherein the display panel comprises a pixel circuit and a driver circuit providing a driving signal for the pixel circuit, wherein the driver circuit comprises the second transistor, and wherein the pixel circuit or the driver circuit comprises the first transistor.

2. The display panel of claim 1, further comprising:
a third insulating layer located on a side of the second gate facing away from the base substrate, wherein a concentration of hydrogen in the third insulating layer is lower than the concentration of hydrogen in the first insulating layer, and the first insulating layer is located on a side of the second active layer facing away from the base substrate.

3. The display panel of claim 2,
wherein the third gate is located on a side of the second insulating layer facing towards the base substrate, and
wherein the concentration of hydrogen in the third insulating layer is lower than or equal to the concentration of hydrogen in the second insulating layer.

4. The display panel of claim 2,
wherein the concentration of hydrogen in the first insulating layer is C1, the concentration of hydrogen in the second insulating layer is C2, and the concentration of hydrogen in the third insulating layer is C3, and
wherein $C1 \leq C2-C3$.

5. The display panel of claim 2,
wherein a concentration of oxygen in the first insulating layer is lower than a concentration of oxygen in the second insulating layer, and
wherein a ratio of the concentration of oxygen in the first insulating layer to a concentration of silicon in the first insulating layer is A, and a ratio of the concentration of oxygen in the second insulating layer to a concentration of silicon in the second insulating layer is B, wherein $A<B$.

6. The display panel of claim 5,
wherein the concentration of hydrogen in the first insulating layer is C1, and the concentration of hydrogen in the second insulating layer is C2,
wherein $C1 \times (A-1) \leq C2 \times (B1)$,
wherein a concentration of oxygen to a concentration of silicon in the third insulating layer is C, and
wherein $A<C<B$.

7. The display panel of claim 6,
wherein the concentration of hydrogen in the third insulating layer is C3, and
wherein $C2 \times (C-1) \leq C3 \times (B-1)$.

8. The display panel of claim 1,
wherein the first insulating layer comprises silicon oxide $SiO_x$, and the second insulating layer comprises silicon oxide $SiO_y$, wherein x is a ratio of a number of oxygen to a number of silicon in the first insulating layer, y is a ratio of a number of oxygen to a number of silicon in the second insulating layer, and $x<y$.

9. The display panel of claim 1,
wherein the concentration of hydrogen in the first insulating layer is C1, and the concentration of hydrogen in the second insulating layer is C2, and
wherein $C1 = n \times C2$, and $1 < n < 5$.

10. The display panel of claim 1,
wherein the first insulating layer is located on a side of the second active layer facing away from the base substrate,
wherein in the first insulating layer, a concentration of hydrogen on a side of the first insulating layer facing towards the second active layer is lower than a concentration of hydrogen on a side of the first insulating layer facing away from the second active layer, and
wherein in the second insulating layer, a concentration of hydrogen on a side of the second insulating layer facing towards the second active layer is lower than a concentration of hydrogen on a side of the second insulating layer facing away from the second active layer.

11. The display panel of claim 1,
wherein the pixel circuit comprises a third transistor, wherein the third transistor comprises a third active layer, a third source, a third drain, and a fourth gate, and wherein the third active layer comprises an oxide semiconductor,
wherein the display panel further comprises a fourth insulating layer and a fifth insulating layer, wherein the fourth insulating layer is located on a side of the third active layer facing away from the base substrate and further between the third active layer and the fourth gate, and wherein the fifth insulating layer is located on a side of the third active layer facing towards the base substrate, and
wherein a concentration of hydrogen in the fourth insulating layer is higher than a concentration of hydrogen in the fifth insulating layer.

12. The display panel of claim 11,
wherein the third transistor is a switch transistor of the pixel circuit, and wherein the concentration of hydrogen in the first insulating layer is higher than the concentration of hydrogen in the fourth insulating layer.

13. The display panel of claim 11,
wherein the third transistor is a drive transistor of the pixel circuit, and wherein the concentration of hydrogen in the first insulating layer is lower than the concentration of hydrogen in the fourth insulating layer.

14. The display panel of claim 11,
wherein the pixel circuit comprises a fourth transistor, wherein the fourth transistor comprises a fourth active layer, a fourth source, a fourth drain, and a fifth gate, and wherein the fourth active layer comprises an oxide semiconductor, wherein the display panel further comprises a sixth insulating layer and a seventh insulating layer, wherein the sixth insulating layer is located on a side of the fourth active layer facing away from the base substrate and further between the fourth active layer and the fifth gate, and wherein the seventh insulating layer is located on a side of the fourth active layer facing towards the base substrate, and wherein a concentration of hydrogen in the sixth insulating layer is higher than a concentration of hydrogen in the seventh insulating layer.

15. The display panel of claim 14, wherein the third transistor is a drive transistor of the pixel circuit, and the fourth transistor is a switch transistor of the pixel circuit, and wherein the concentration of hydrogen in the fourth insulating layer is higher than the concentration of hydrogen in the sixth insulating layer.

16. A display device, comprising the display panel according to claim 1.

17. A display panel, comprising:

a second transistor, wherein the second transistor comprises a second active layer, a second gate, a third gate, a second source, and a second drain, and wherein the second active layer comprises an oxide semiconductor; and a first insulating layer and a second insulating layer, wherein the first insulating layer and the second insulating layer are located on both sides of the second active layer, wherein the first insulating layer is located between the second gate and the second active layer, wherein the second insulating layer is located between the third gate and the second active layer, and wherein a thickness of the first insulating layer is less than a thickness of the second insulating layer, wherein a concentration of hydrogen in the first insulating layer is higher than a concentration of hydrogen in the second insulating layer; and wherein the display panel comprises a pixel circuit and a driver circuit providing a driving signal for the pixel circuit, wherein the driver circuit comprises the second transistor.

18. A display device, comprising the display panel according to claim 17.

19. A display panel, comprising:

a second transistor, wherein the second transistor comprises a second active layer, a second gate, a third gate, a second source, and a second drain, and wherein the second active layer comprises an oxide semiconductor; and a first insulating layer and a second insulating layer, wherein the first insulating layer and the second insulating layer are located on both sides of the second active layer, wherein the first insulating layer is located between the second gate and the second active layer, wherein the second insulating layer is located between the third gate and the second active layer, and wherein a thickness of the first insulating layer is less than a thickness of the second insulating layer, wherein a concentration of hydrogen in the first insulating layer is higher than a concentration of hydrogen in the second insulating layer.

20. A display device, comprising the display panel according to claim 19.

* * * * *